United States Patent
Chen

[11] Patent Number: 5,998,262
[45] Date of Patent: Dec. 7, 1999

[54] METHOD FOR MANUFACTURING ETOX CELL HAVING DAMAGE-FREE SOURCE REGION

[75] Inventor: Chih-Ming Chen, Hsinchu, Taiwan

[73] Assignee: Worldwide Semiconductor Manufacturing Corp., Taipei, Taiwan

[21] Appl. No.: 09/065,369

[22] Filed: Apr. 23, 1998

[51] Int. Cl.[6] .................................................. H01L 21/336
[52] U.S. Cl. ........................ 438/257; 438/264; 438/258
[58] Field of Search ........................... 365/185; 257/316, 257/320; 438/257, 258, 264

[56] References Cited

U.S. PATENT DOCUMENTS

| | | | |
|---|---|---|---|
| 4,958,321 | 9/1990 | Chang | 365/185 |
| 5,371,031 | 12/1994 | Gill et al. | 437/52 |
| 5,376,573 | 12/1994 | Richart et al. | 437/48 |
| 5,429,971 | 7/1995 | Yang | 437/43 |
| 5,449,629 | 9/1995 | Kajita | 437/43 |
| 5,656,840 | 8/1997 | Yang | 257/316 |
| 5,792,670 | 8/1998 | Pio et al. | 437/43 |

*Primary Examiner*—John F. Niebling
*Assistant Examiner*—Walter L. Lindsay, Jr.
*Attorney, Agent, or Firm*—Thomas, Kayden, Horstemeyer & Risley

[57] ABSTRACT

A method for manufacturing EPROM tunnel oxide cell having a damage-free source region. The method comprises the step of providing a substrate having a device region formed thereon, and then forming an ion-implanted region in the device area. Next, a gate oxide layer is formed over the substrate. Subsequently, a floating gate, a dielectric layer, a control gate and an oxide layer are sequentially formed above the substrate. This invention utilizes the implantation of a moderately heavy dose of ions into a device area prior to the formation of the gate oxide layer, so that a thicker gate oxide layer is formed above the source region. Hence, when the first polysilicon layer is etched in a subsequent self-aligned etching operation to establish the common source region, the thicker gate oxide layer can serve as a protective layer for the source region.

12 Claims, 6 Drawing Sheets

METHOD FOR MANUFACTURING ETOX CELL HAVING DAMAGE-FREE SOURCE REGION

CROSS-REFERENCE TO RELATED APPLICATION

This application claims the priority benefit of Taiwan application serial no. 87100408, filed Jan. 14, 1998, the full disclosure of which is incorporated herein by reference.

BACKGROUND OF THE INVENTION

1. Field of Invention

The present invention relates to an EEPROM structure. More particularly, the present invention relates to a method for manufacturing EPROM tunnel oxide (ETOX) cell that will not result in any damages to its source region.

2. Description of Related Art

Electrically erasable programmable ROM (EEPROM) is a kind of memory that is now extensively used in computers and electronic products. The advantage of EEPROM is its ability to retain written programs and data permanently, yet can reuse those memory spaces by erasing those programs and data. The erase operation is simple. One only has to pass an electric current into the memory circuit for a predefined period. Fresh new data or programs can then be re-programmed in and stored. Moreover, memory store, erase and read operations can be repeated many times and can be carried out in a bit-by-bit manner, and so an EEPROM is very similar to a disk drive functionally. Additionally, another kind of EEPROM memory known as flash memory developed by Intel that operates in a block-by-block manner is now in the market. Although data have to be modified one block at a time, its fast operational speed is more than compensated by this minor defect.

FIGS. 1A through 1C and FIGS. 2A through 2C are various top and cross-sectional views showing the progression of manufacturing steps in producing a conventional ETOX cell. FIG. 1A is a top view showing the initial layout in ETOX cell fabrication. FIG. 1B is a cross-sectional view along line AA' of FIG. 1A, and FIG. 1C is a cross-sectional view along line BB' of FIG. 1A.

First, as shown in FIGS. 1A, 1B and 1C, a substrate 10 is provided. Then, a local oxidation of silicon (LOCOS) method is used to form field oxide layers 12 above the substrate 10 to define the device area. Next, a gate oxide layer 14 (tunnel oxide layer) is formed above the substrate 10 using a thermal oxidation method. Thereafter, a polysilicon layer preferably having a thickness of about 1000 Å is formed covering the whole substrate structure using, for example, a low-pressure chemical vapor deposition method. Then, a dielectric layer 18 is formed over the polysilicon layer, wherein the dielectric layer 18 can be an oxide/nitride/oxide (ONO) composite layer. Subsequently, the dielectric layer 18 and the polysilicon layer are patterned to remove the dielectric layer and polysilicon layer lying above the device area, and forming a polysilicon layer 16. Finally, a substrate structure as shown in FIGS. 1A through 1C is obtained.

FIGS. 2A through 2C are top and cross-sectional views showing the subsequent stage in the manufacturing of a conventional ETOX cell. FIG. 2A is a cross-sectional view along line AA' of FIG. 2C, FIG. 2B is a cross-sectional view along line BB' of FIG. 2C and FIG. 2C is a top view of the final layout.

Next, as shown in FIG. 2A and FIG. 2B, high concentration of ions are implanted into the source region inside the device area to form a buried ion-implanted region 19. Subsequently, thermal oxidation is carried out to grow a gate oxide layer above the source region. Oxide layer formed by the thermal oxidation is thicker in areas above the source region because the source region has heavily doped ions. Thereafter, a layer of polysilicon preferably having a thickness of about 3000 Å is deposited over the whole substrate structure to form a second polysilicon layer 21 using, for example, a low-pressure chemical vapor deposition method. After that, an oxide layer 22 is deposited over the second polysilicon layer 21 using, for example, an atmospheric pressure chemical vapor deposition method. The oxide material for forming the oxide layer 22 can be TEOS oxide, for example.

Thereafter, using the dielectric layer 18 as an etching stop layer, conventional photolithographic and etching processes are used to pattern the second polysilicon layer 21 and the oxide layer 22. Thus, the second polysilicon layer 21 becomes a control gate. In the subsequent step, a self-aligned source terminal etching operation is carried out to pattern the first polysilicon layer 16 into a floating gate. Then, a common source region is formed above the substrate 10. Finally, a complete substrate structure is formed whose top view is shown in FIG. 2C.

In the above method, since the dielectric layer 18 does not form a good protective layer for the first polysilicon layer 16, subsequently formed substrate structure will have data storage problems. Hence, few manufacturers will use this method to fabricate flash memory.

Furthermore, in using a conventional manufacturing method, a trench will be formed above the common source region of the substrate 10. This trench will cut off normal connection between common source regions, and will lead to functional abnormality of ETOX cell. Furthermore, even connection between common source regions still exists; damages caused by etching will raise the resistance in the common source regions. Hence, read/write efficiency of an ETOX cell will be lowered.

To reduce damages caused by the trench, one method is to increase junction depth of the source region. However, this will reduce the effective channel width of an ETOX cell, leading to difficulties in reducing ETOX cell dimensions.

In light of the foregoing, there is a need to provide a method for manufacturing ETOX cell that will not damage the source region.

SUMMARY OF THE INVENTION

Accordingly, the present invention is to provide a method for manufacturing ETOX cell that can prevent the damaging effects on source region for a conventional fabricating method.

To achieve these and other advantages and in accordance with the purpose of the invention, as embodied and broadly described herein, the invention provides a method for manufacturing ETOX cell that will produce a damage-free source region. The method comprises the steps of first providing a substrate having field oxide layers formed thereon for defining a device area, and then forming an ion-implanted region in the source region inside the device area. Subsequently, a gate oxide layer is formed over the substrate, and then a first polysilicon layer is formed over the gate oxide layer. Afterwards, the first polysilicon layer is patterned.

Thereafter, a dielectric layer is formed over the first polysilicon layer and the exposed gate oxide layer, and then a second polysilicon layer is formed over the dielectric layer. Next, an oxide layer is formed over the second polysilicon layer, and then the second polysilicon layer is patterned to form a control gate while the dielectric layer above the buried ion-implanted region in the source region is also exposed. Subsequently, a self-aligned etching operation is used to pattern the dielectric layer and the first polysilicon layer so that the first polysilicon layer becomes a floating gate. Then, a common source region is formed above the substrate, wherein the thicker gate oxide layer in the source region is able to protect the substrate during the self-aligned etching operation of the first polysilicon layer. Ultimately, no trenches are formed in the source region.

The practice of implanting a moderately heavy dose of ions into a device area prior to forming a gate oxide layer is able to form a thicker gate oxide layer above the source region. Hence, when a subsequent self-aligned etching operation is carried out to form a stack-gate, the thick gate oxide layer can serve as a protective layer for the source region. Consequently, over-etching to form trenches in the source drain region is avoided, and high resistance in the source drain region caused by damages is prevented. Thus, functional efficiency of an ETOX cell remains high during read/write operation.

The practice of implanting a moderately heavy dose of ions into a device area prior to forming a gate oxide layer instead of implanting ions after patterning the first polysilicon layer as in a conventional method is better at keeping the problem of data retention away.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
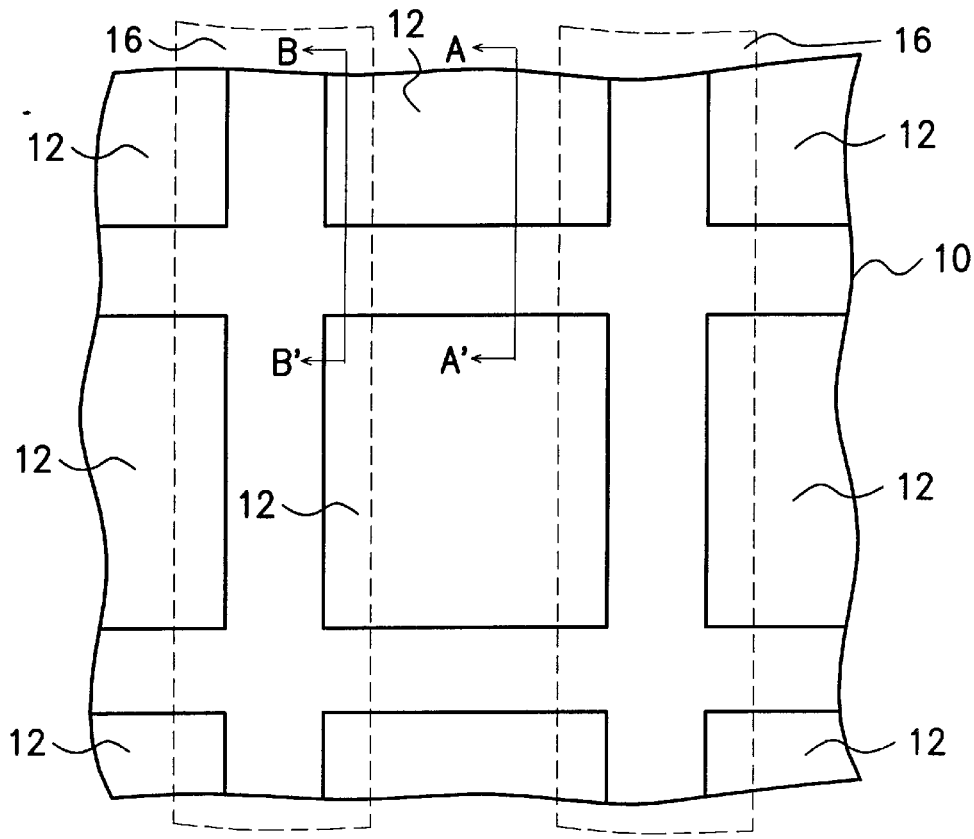
FIG. 1A is a top view showing the manufacturing flow of a conventional ETOX cell.
Figure 1B:
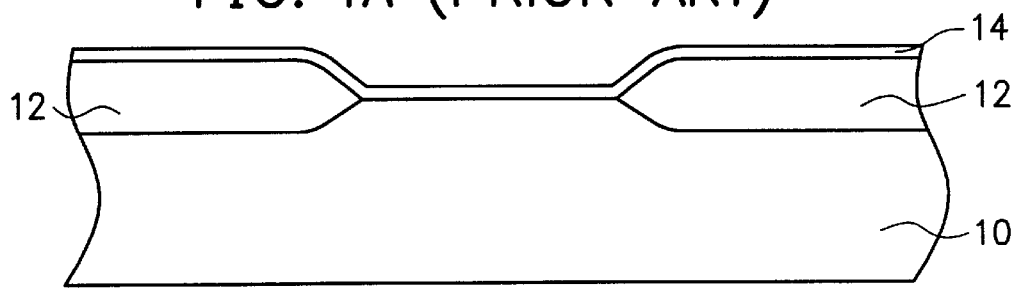
FIG. 1B is a cross-sectional view along line AA' of FIG. 1A.
Figure 1C:
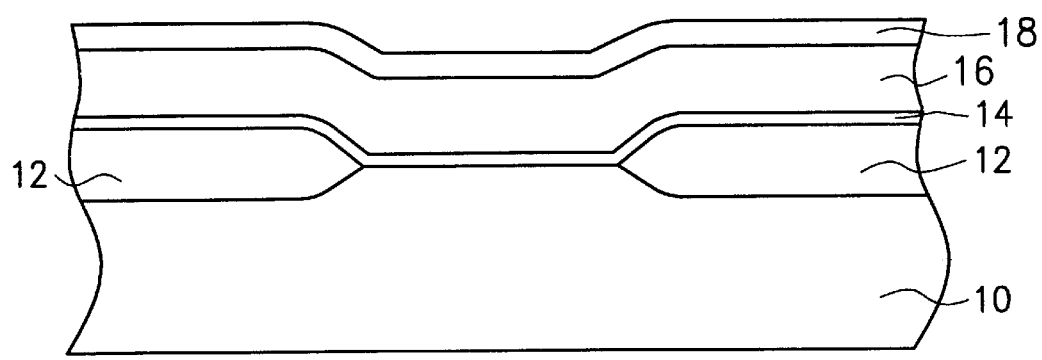
FIG. 1C is a cross-sectional view along line BB' of FIG. 1A.
Figure 2A:
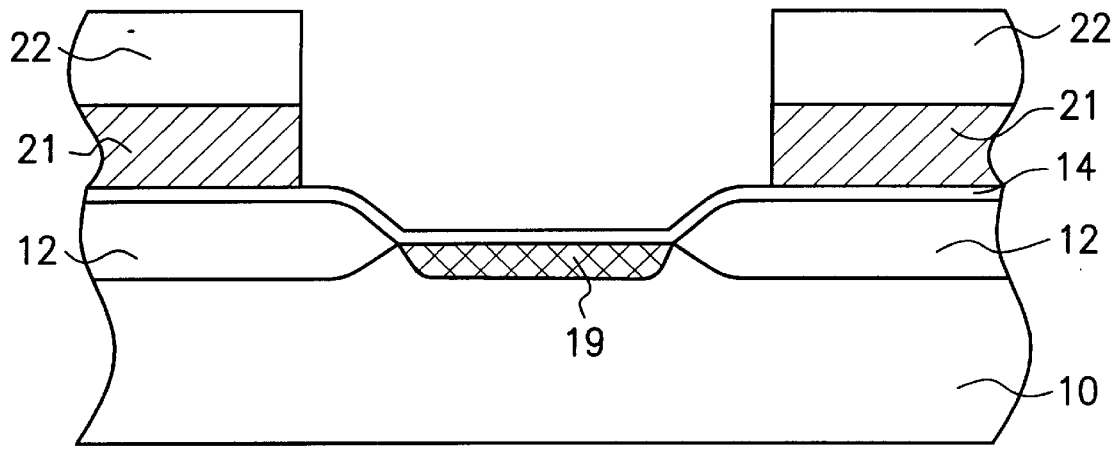
FIG. 2A is a cross-sectional view showing the manufacturing flow of a conventional ETOX cell, the cross-section is taken along line AA'.
Figure 2B:
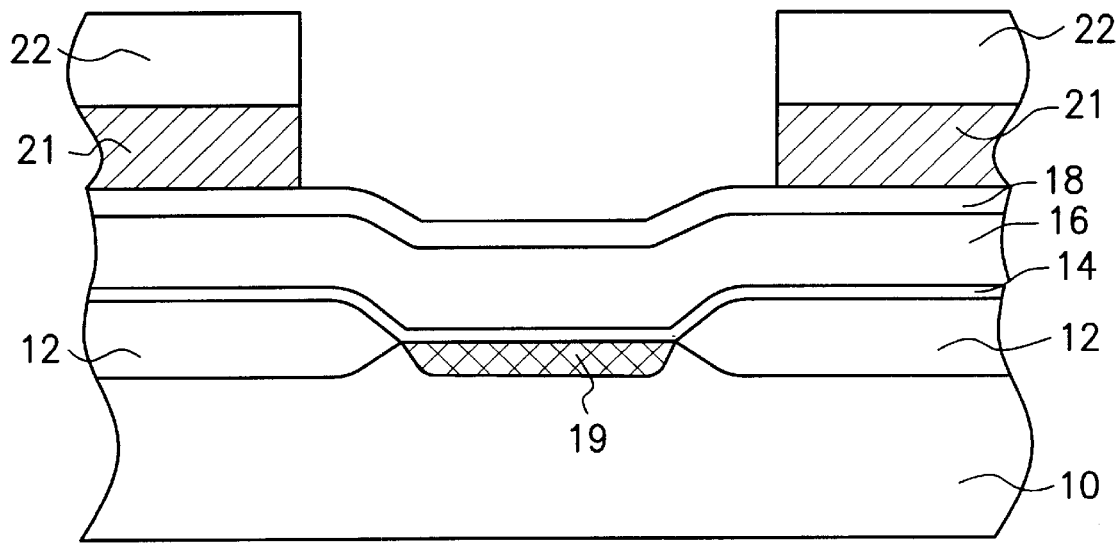
FIG. 2B is a cross-sectional view showing the manufacturing flow of a conventional ETOX cell, the cross-section is taken along line BB'.
Figure 2C:
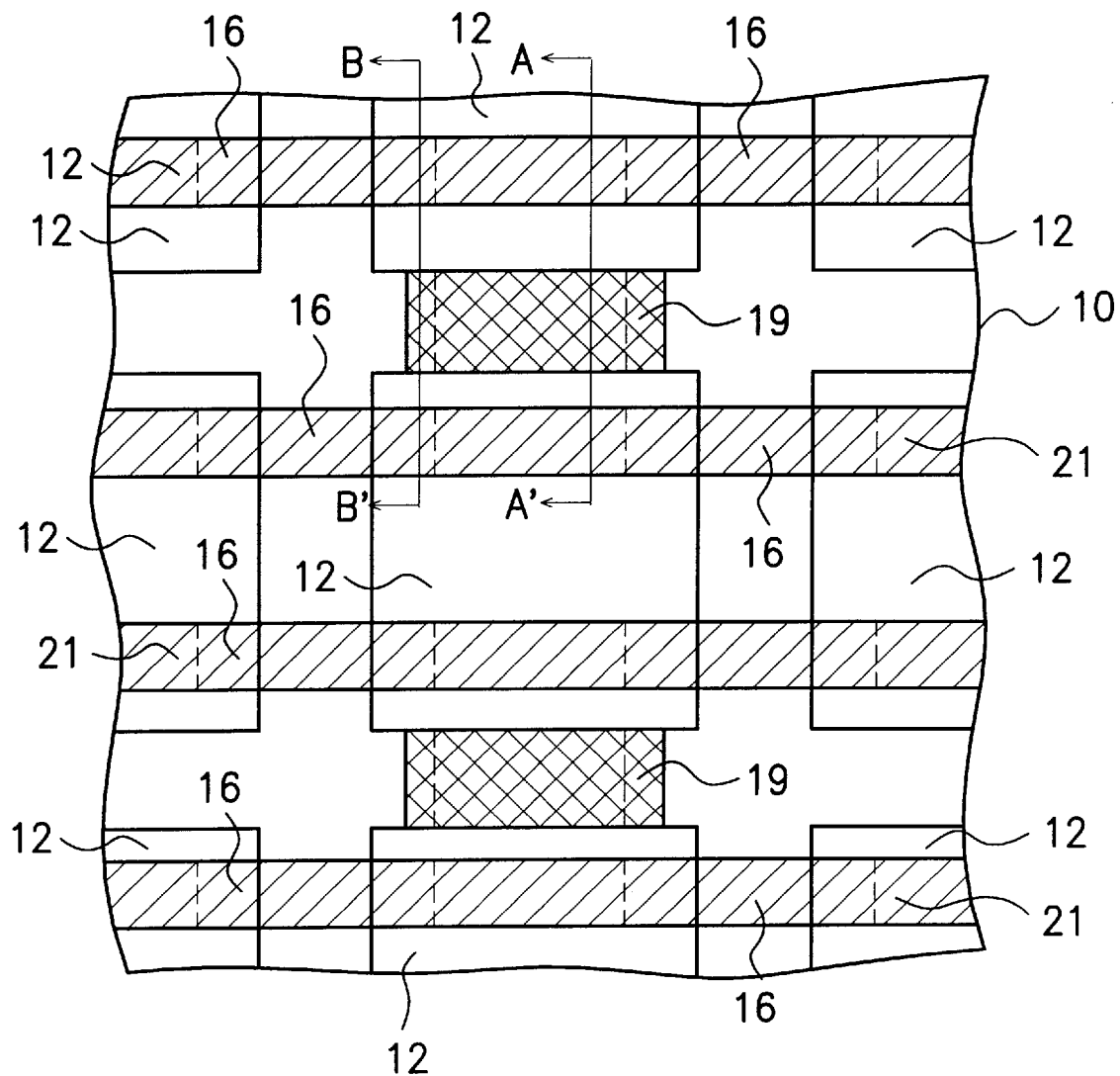
FIG. 2C is a top view showing the manufacturing flow of a conventional ETOX cell.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 5B are top views and cross-sectional views showing the progression of manufacturing steps in producing an ETOX cell having a damage-free source region according to one preferred embodiment of this invention.

Figure 3A:
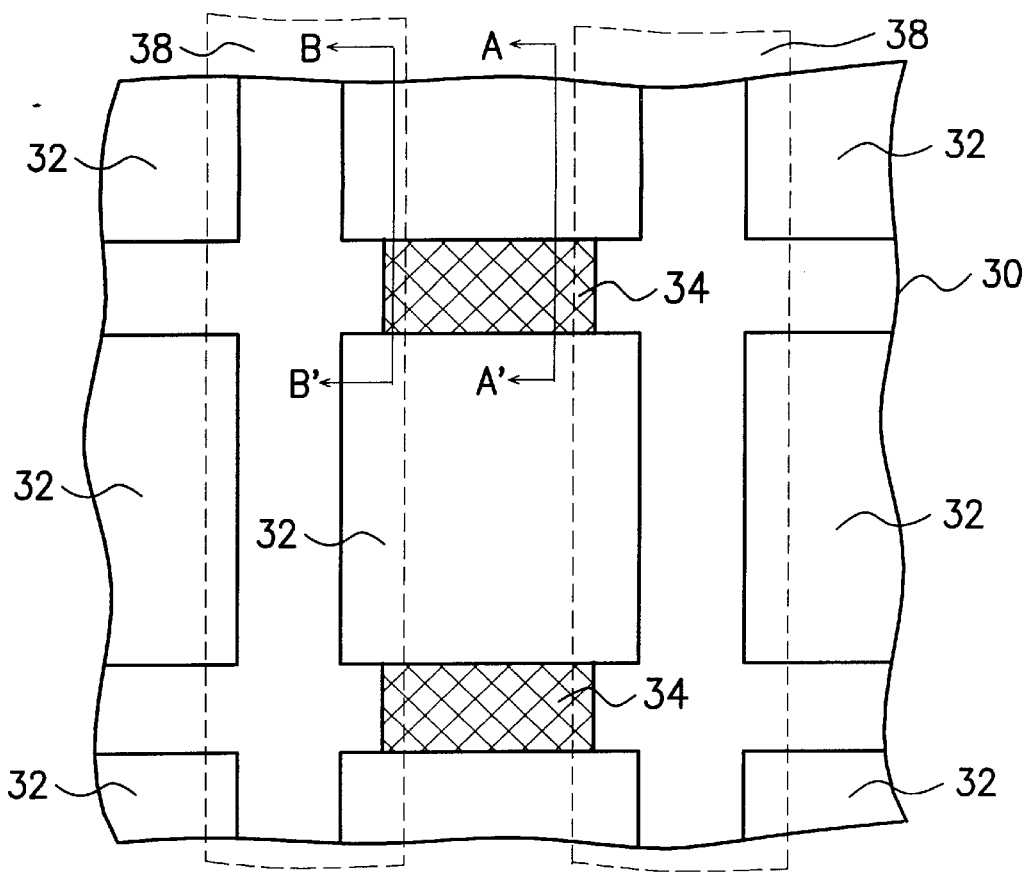
FIG. 3A is a top view showing the manufacturing flow of an ETOX cell having a damage-free source region according to one preferred embodiment of this invention.
Figure 3B:
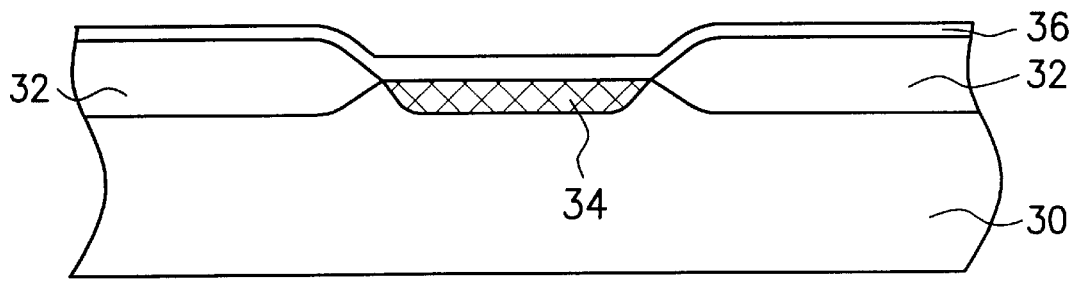
FIG. 3B is a cross-sectional view showing the manufacturing flow of an ETOX cell having a damage-free source region according to one preferred embodiment of this invention, where the cross-section is taken along line AA' of FIG. 3A.
Figure 3C:
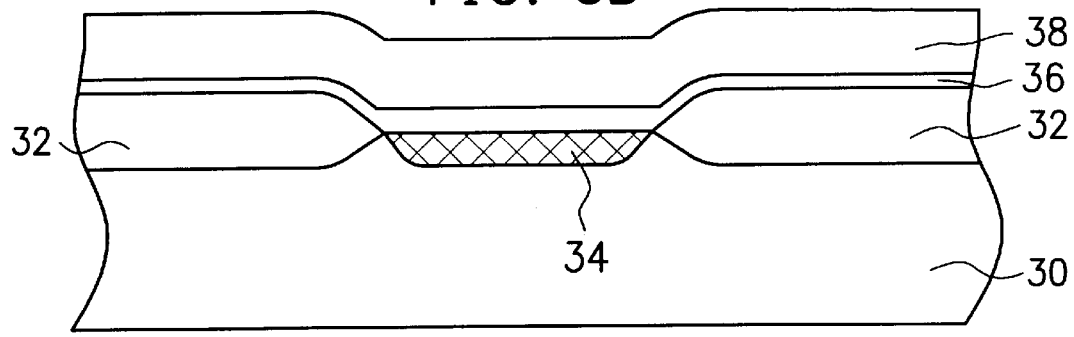
FIG. 3C is a cross-sectional view showing the manufacturing flow of an ETOX cell having a damage-free source region according to one preferred embodiment of this invention, where the cross-section is taken along line BB' of FIG. 3A.

First, as shown in FIGS. 3A through 3C, a substrate 30 is provided. Then, field oxide layers 32 are formed above the substrate 30 to define an active area using, for example, a LOCOS method. Next, an ion implantation method is used to implant a moderately heavy dose of ions into the device area forming a buried ion-implanted region 34. Thereafter, thermal oxidation is conducted to form a gate oxide layer 36 over the substrate structure. Because the buried ion-implanted region 34 contains a high concentration of ions, a rather thick gate oxide layer 36 of about 90 Å is formed above the substrate. Subsequently, a polysilicon layer preferably having a thickness of about 1000 Å is deposited over the whole substrate structure using, for example, a low-pressure chemical vapor deposition method. Then, a first polysilicon layer patterning is performed to form a first polysilicon layer 38.

Figure 4A:
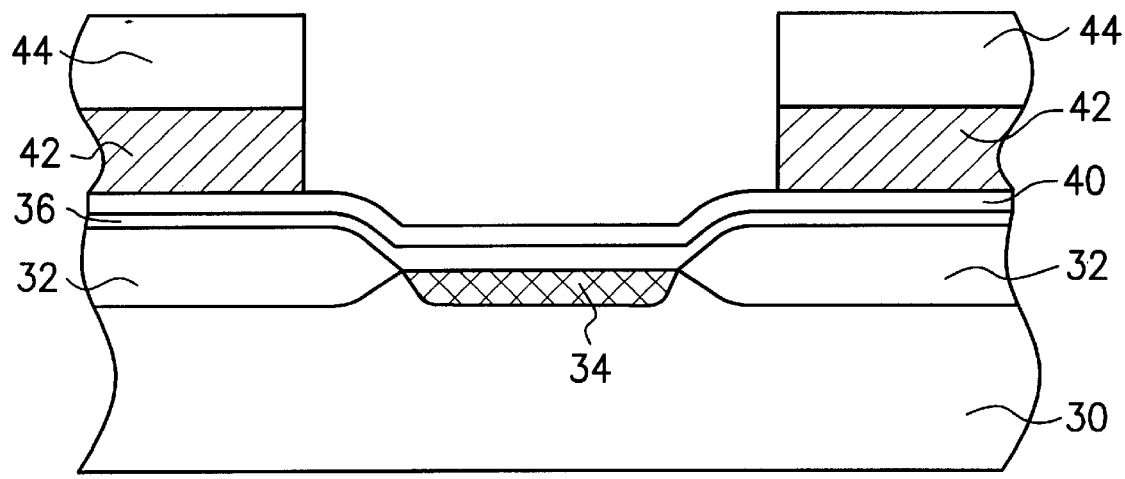
FIG. 4A is a cross-sectional view showing the manufacturing flow of an ETOX cell having a damage-free source region according to one preferred embodiment of this invention, where the cross-section is taken along line AA' of FIG. 3A.
Figure 4B:
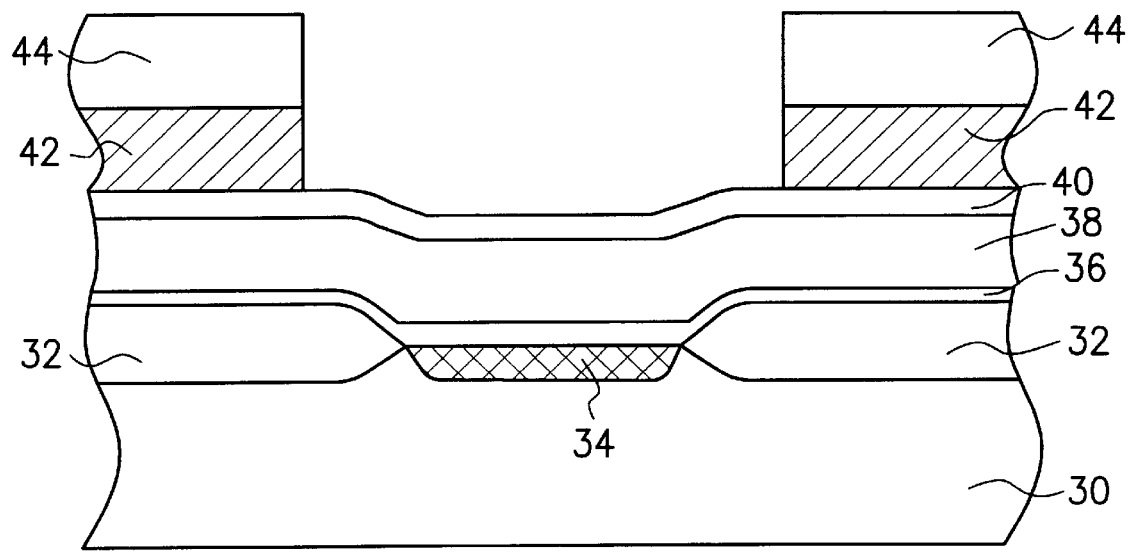
FIG. 4B is a cross-sectional view showing the manufacturing flow of an ETOX cell having damage-free source region according to one preferred embodiment of this invention, where the cross-section is taken along line BB'.

Next, as shown in FIG. 4A and FIG. 4B, a dielectric layer 40 is formed over the substrate structure. The dielectric layer 40 can be a stack of layers such as an oxide/nitride/oxide (ONO) composite layer. Thereafter, a polysilicon layer preferably having a thickness of about 1000 Å is deposited over the whole substrate structure to form a second polysilicon layer 42 using, for example, a low-pressure chemical vapor deposition method. In the subsequent step, an oxide layer 44 is formed over the second polysilicon layer 42 using, for example, an atmospheric pressure chemical vapor deposition method. The oxide layer 44 can be formed from TEOS oxide, for example. Next, conventional photolithographic and etching processes are used to pattern the oxide layer 44 and the second polysilicon layer 42, using the dielectric layer 40 as an etching stop layer. Finally, the second polysilicon layer 42 is transformed into a control gate.

Figure 5A:
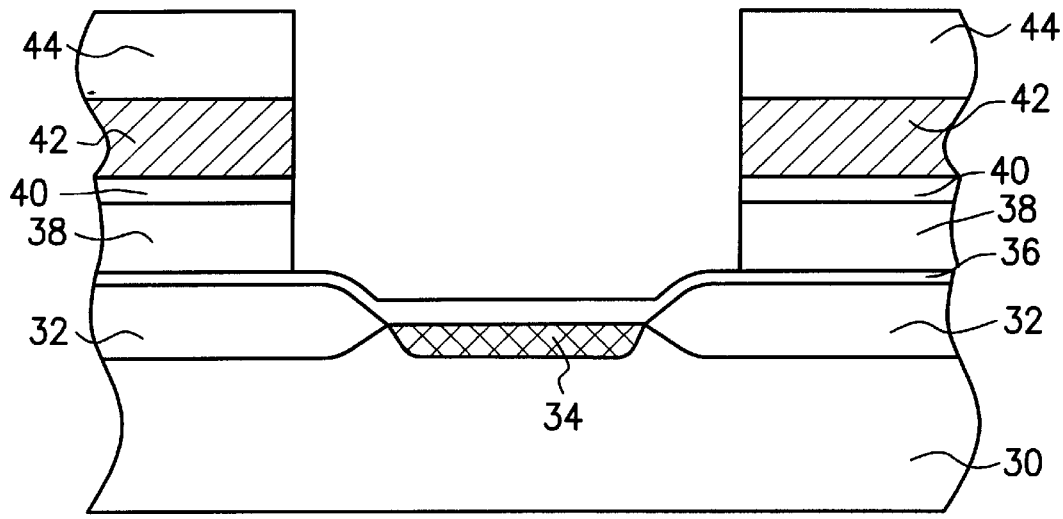
FIG. 5A is a cross-sectional view showing the manufacturing flow of an ETOX cell having a damage-free source region according to one preferred embodiment of this invention, where the cross-section is taken along line BB'.
Figure 5B:
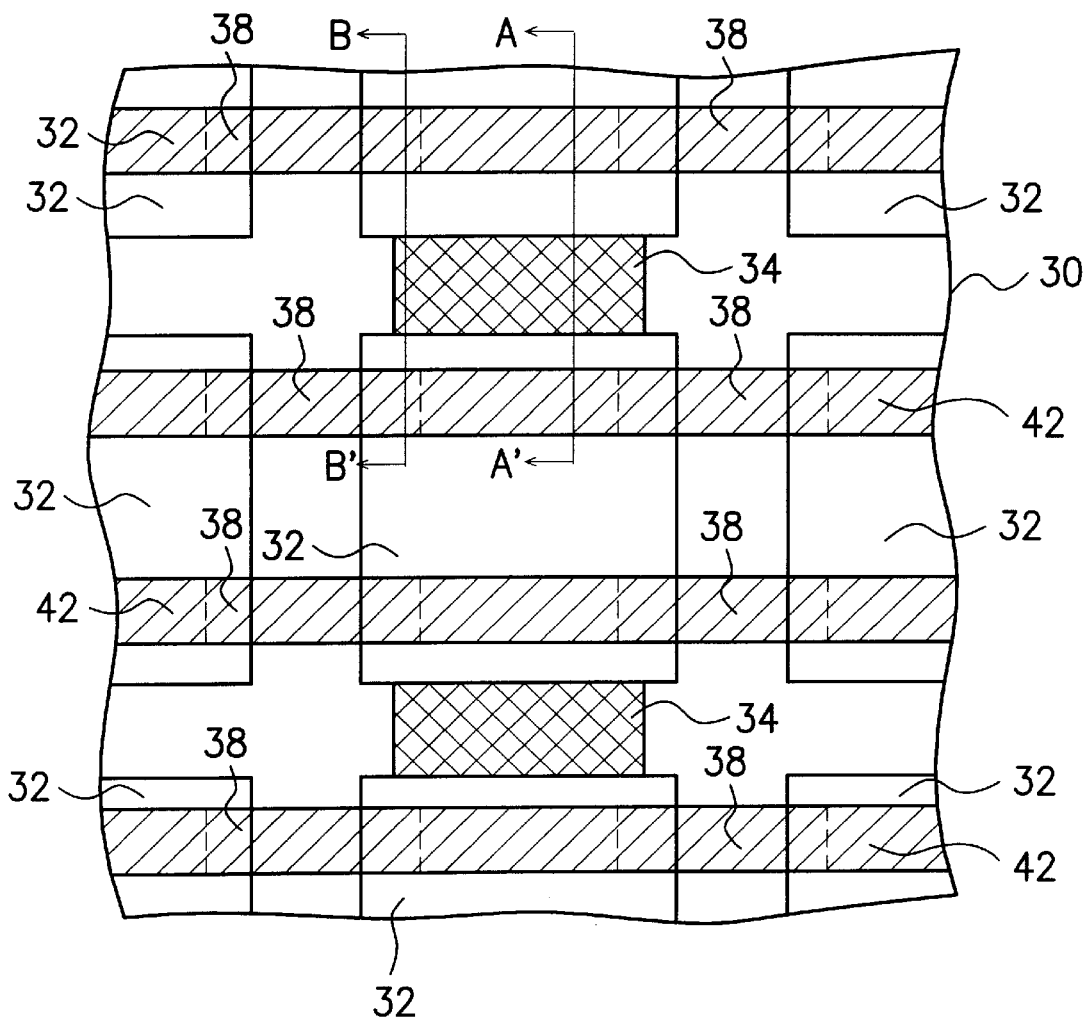
FIG. 5B is a top view showing the manufacturing flow of an ETOX cell having a damage-free source region according to one preferred embodiment of this invention.

Subsequently, with the structure shown in FIG. 4B, a self-aligned etching operation is carried out using the oxide layer 44 as a mask to form the structure as shown in FIG. 5A. For example, a dry etching method of a wet etching method having a high selectivity ratio is used to remove the exposed dielectric layer 40. Then, etching continues on and the first polysilicon layer 38 uncovered by the second polysilicon layer 42 is patterned for a second time so that the first polysilicon layer 38 now transforms into a floating gate. Finally, a common source region is patterned out of the substrate 30. Ultimately, the whole substrate structure having a top view as shown in FIG. 5B is obtained.

As shown in FIG. 4A, since no first polysilicon layer 38 lies above the gate oxide layer 36, a thicker gate oxide layer 36 is able to form in the device area. This thicker gate oxide layer is able to prevent the formation of trenches in the source region during self-aligned etching operation. In this invention, the gate oxide layer 36 above the buried ion-implanted region 34 acts as a protective layer covering the source region. Therefore, when the first polysilicon layer 38 is etched, production of trenches in the source region due to over-etching is prevented.

Finally, subsequent processing steps necessary for completing the fabrication of an ETOX cell are carried out. Since these steps involve conventional operations, detailed descriptions are omitted here.

The practice of implanting a moderately heavy dose of ions into a device area prior to the formation of a gate oxide layer 36 is able to form a thicker gate oxide layer above the source region. Hence, when a subsequent self-aligned etching operation is carried out to form a stack-gate, the thicker gate oxide layer can serve as a protective layer for the source region. Consequently, no trenches are formed in the source drain region resulting from over-etching, and a high resistance in the source drain region due to damages is prevented. Thus, the functional efficiency of an ETOX cell will remain high during read/write operations.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing ETOX cell having a damage-free source region, comprising the steps of:

providing a substrate having a field oxide layer for defining a device area already formed thereon;

forming an ion-implanted region above the substrate in the device area;

forming a gate oxide layer over the substrate, wherein the gate oxide layer covering the ion-implanted region is thicker;

forming a first polysilicon layer over the gate oxide layer;

patterning the first polysilicon layer to expose the gate oxide layer above the ion-implanted region;

forming a dielectric layer over the first polysilicon layer and the exposed gate oxide layer;

forming a second polysilicon layer over the dielectric layer;

forming an oxide layer over the second polysilicon layer;

patterning the second polysilicon layer to form a control gate and exposing the dielectric layer above the ion-implanted region; and patterning the dielectric layer and the first polysilicon layer to form a floating gate in the first polysilicon layer, and then patterning out a common source region above the substrate.

2. The method of claim 1, wherein the step of forming the ion-implanted region includes an ion implantation method.

3. The method of claim 1, wherein the step of forming the ion-implanted region includes implanting heavily concentrated ions using an ion implantation method.

4. The method of claim 1, wherein the step of forming the gate oxide layer includes a thermal oxidation method.

5. The method of claim 1, wherein the step of forming the first polysilicon layer includes a low-pressure chemical vapor deposition method.

6. The method of claim 1, wherein the step of forming the second polysilicon layer includes a low-pressure chemical vapor deposition method.

7. The method of claim 1, wherein the step of forming the oxide layer includes an atmospheric pressure chemical vapor deposition method.

8. The method of claim 1, wherein the gate oxide layer has a thickness of about 90 Å.

9. The method of claim 1, wherein the first polysilicon layer has a thickness of about 1000 Å.

10. The method of claim 1, wherein the second polysilicon layer has a thickness of about 1000 Å.

11. The method of claim 1, wherein the step of forming the dielectric layer includes depositing sequentially silicon oxide, silicon nitride and silicon oxide to form a stacked oxide/nitride/oxide composite layer.

12. The method of claim 1, wherein the step of forming the oxide layer includes depositing TEOS oxide material.

* * * * *